(12) United States Patent
Marimuthu et al.

(10) Patent No.: US 11,823,962 B2
(45) Date of Patent: Nov. 21, 2023

(54) BACK END OF LINE (BEOL) PROCESS CORNER SENSING

(71) Applicant: QUALCOMM Incorporated, San Diego, CA (US)

(72) Inventors: Saravanan Marimuthu, Bangalore (IN); De Lu, San Diego, CA (US); Baldeo Sharan Sharma, Bangalore (IN); Peeyush Kumar Parkar, Bangalore (IN); Venkat Narayanan, San Diego, CA (US); Rui Li, San Diego, CA (US); Samy Shafik Tawfik Zaynoun, San Diego, CA (US); Min Chen, San Diego, CA (US); David Kidd, San Diego, CA (US); Amit Patil, Bengaluru (IN)

(73) Assignee: QUALCOMM INCORPORATED, San Diego, CA (US)

(*) Notice: Subject to any disclaimer, the term of this patent is extended or adjusted under 35 U.S.C. 154(b) by 527 days.

(21) Appl. No.: 17/180,652

(22) Filed: Feb. 19, 2021

(65) Prior Publication Data
US 2022/0270938 A1 Aug. 25, 2022

(51) Int. Cl.
*H01L 21/66* (2006.01)
*G06F 30/398* (2020.01)

(52) U.S. Cl.
CPC ............ *H01L 22/14* (2013.01); *G06F 30/398* (2020.01); *H01L 22/34* (2013.01)

(58) Field of Classification Search
None
See application file for complete search history.

(56) References Cited

U.S. PATENT DOCUMENTS

| | | |
|---|---|---|
| 5,811,983 A | 9/1998 | Lundberg |
| 2014/0015562 A1 | 1/2014 | Dwivedi et al. |
| 2017/0187358 A1* | 6/2017 | Takeuchi ........... G01R 31/2856 |

OTHER PUBLICATIONS

Takeuchi, K., et al., "FEO/BEOL Wear-Out Estimator Using Stress-to-Frequency Conversion of Voltage/Temperature-Sensitive Ring Oscillators for 28nm Automotive MCUs", ESSCIRC Conference 2016: 42nd European Solid-State Circuits Conference, IEEE, Sep. 12, 2016 (Sep. 12, 2016), XP032980859, pp. 265-268, (Year: 2016)*

(Continued)

*Primary Examiner* — Tuan N Nguyen
(74) *Attorney, Agent, or Firm* — Loza & Loza, LLP

(57) ABSTRACT

Aspects of the disclosure are directed to sensing integrated circuit (IC) Back End Of Line (BEOL) process corners. In one aspect, an apparatus for sensing IC BEOL process corners includes a ring oscillator including a plurality of ring oscillator stages configured to generate an output waveform with a frequency state; and a shield net circuit including a plurality of shield net stages corresponding to the plurality of ring oscillator stages, the shield net circuit having a toggle input. And, a method includes generating an output waveform with a frequency state using a ring oscillator that includes a plurality of ring oscillator stages; modifying a plurality of ring oscillator stage time delays through a coupling between a plurality of shield net stages and the plurality of ring oscillator stages; and selecting the frequency state using a toggle input of a shield net circuit which includes the plurality of shield net stages.

22 Claims, 6 Drawing Sheets

(56) References Cited

OTHER PUBLICATIONS

International Search Report and Written Opinion—PCT/US2022/015689—ISA/EPO—dated Jun. 2, 2022.
Takeuchi, K., et al., "FEOL/BEOL Wear-Out Estimator Using Stress-to-Frequency Conversion of Voltage/Temperature-Sensitive Ring Oscillators for 28nm Automotive MCUs", ESSCIRC Conference 2016: 42nd European Solid-State Circuits Conference, IEEE, Sep. 12, 2016 (Sep. 12, 2016), XP032980859, pp. 265-268, DOI: 10.1109/ESSCIRC.2016.7598293 [retrieved on Oct. 18, 2016] the whole document.

* cited by examiner

FIG. 6

610 —
An output waveform with a frequency state is generated using a ring oscillator (RO), wherein the ring oscillator (RO) includes a plurality of ring oscillator (RO) stages.

620 —
A plurality of ring oscillator (RO) stage time delays is modified through a coupling between a plurality of shield net stages and the plurality of ring oscillator (RO) stages.

630 —
The frequency state is selected using a toggle input of a shield net circuit, wherein the shield net circuit includes the plurality of shield net stages.

BACK END OF LINE (BEOL) PROCESS CORNER SENSING

TECHNICAL FIELD

This disclosure relates generally to the field of integrated circuit (IC) performance, and, in particular, to back end of line (BEOL) process corner sensing.

BACKGROUND

Integrated circuits (ICs) are part of the essential infrastructure of modern life. Nearly all consumer, industrial, government, scientific and technological products rely on integrated circuits to implement critical functionality. Due to the phenomenal advances in electronics miniaturization over several decades, current ICs have billions of active devices, such as transistors, embedded and interconnected within a single monolithic structure. Monitoring of IC back end of line (BEOL) process corners may be needed for an accurate assessment of IC yield and optimization of IC performance.

One type of IC BEOL process corner monitor is an on-chip sensor, such as a ring oscillator (RO) with a plurality of RO stages. An RO generates an output waveform with an RO frequency. The RO frequency depends on time delays in the plurality of RO stages (RO stage time delays). Since the time delays depend on IC BEOL process corner parameters, the RO frequency may be used as a performance metric to detect and monitor IC BEOL process corners. However, some existing implementations of an RO may not have adequate RO frequency discrimination to detect and monitor the IC BEOL process corners.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides sensing of integrated circuit (IC) back end of line (BEOL) process corners. Accordingly, an apparatus for sensing integrated circuit (IC) Back End Of Line (BEOL) process corners, the apparatus including: a ring oscillator including a plurality of ring oscillator stages configured to generate an output waveform with a frequency state; and a shield net circuit including a plurality of shield net stages corresponding to the plurality of ring oscillator stages, the shield net circuit having a toggle input configured to receive a control signal Cg.

In one example, the frequency state is either a first frequency state or a second frequency state; wherein a value of the first frequency state is greater than a value of a first intrinsic frequency state, and a value of the second frequency state is less than a value of a second intrinsic frequency state; and wherein the value of the first intrinsic frequency state and the value of the second intrinsic frequency state are independent of the shield net circuit.

In one example, the plurality of ring oscillator stages has a plurality of ring oscillator stage time delays which include resistance capacitance (RC) time delays. In one example, the apparatus further includes a plurality of ring oscillator interconnections, wherein each of the plurality of ring oscillator interconnections is between two adjacent ring oscillator stages of the plurality of ring oscillator stages. In one example, each of the plurality of ring oscillator stage time delays includes a resistance and a capacitance of each of the plurality of ring oscillator interconnections.

In one example, the IC BEOL process corners are based on resistance values and capacitance values of the plurality of ring oscillator interconnections. In one example, a coupling exists between each of the plurality of shield net stages and its corresponding one of the plurality of ring oscillator stages. In one example, the coupling is a capacitive coupling.

In one example, the toggle input includes a bilevel state. In one example, the toggle input is configurable to set the frequency state based on the bilevel state. In one example, the toggle input is configurable to select the frequency state by modifying a plurality of ring oscillator stage time delays through a coupling between the plurality of shield net stages and the plurality of ring oscillator stages. In one example, the apparatus further includes an additional ring oscillator stage coupled to the plurality of ring oscillator stages, wherein the plurality of ring oscillator stages is an even quantity.

Another aspect of the disclosure provides a method for sensing integrated circuit (IC) Back End Of Line (BEOL) process corners, the method including: generating an output waveform with a frequency state using a ring oscillator, wherein the ring oscillator includes a plurality of ring oscillator stages; modifying a plurality of ring oscillator stage time delays through a coupling between a plurality of shield net stages and the plurality of ring oscillator stages; and selecting the frequency state using a toggle input of a shield net circuit, wherein the shield net circuit includes the plurality of shield net stages.

In one example, the frequency state is either a first frequency state or a second frequency state; wherein a value of the first frequency state is greater than a value of a first intrinsic frequency state, and a value of the second frequency state is less than a value of a second intrinsic frequency state; and wherein the value of the first intrinsic frequency state and the value of the second intrinsic frequency state are independent of the shield net circuit.

In one example, each of the plurality of ring oscillator stage time delays is a resistance capacitance (RC) time delay. In one example, the ring oscillator includes a plurality of ring oscillator interconnections, and wherein each of the plurality of ring oscillator interconnections is between two adjacent ring oscillator stages of the plurality of ring oscillator stages.

In one example, the each of the plurality of ring oscillator stage time delays includes a resistance and a capacitance of the each of the plurality of ring oscillator interconnections. In one example, the IC BOEL process corners are based on resistance values and capacitance values of the plurality of ring oscillator interconnections. In one example, the coupling is capacitive coupling. In one example, the toggle input includes a bilevel state.

In one example, the method further includes setting the bilevel state of the toggle input to set the frequency state. In one example, the frequency state provides sensing discrimination among the IC BOEL process corners based on the coupling between the plurality of shield net stages and the plurality of ring oscillator stages. In one example, the frequency state is based on a match between the plurality of ring oscillator stage time delays and a plurality of time delays of the plurality of shield net stages.

Another aspect of the disclosure provides an apparatus for sensing integrated circuit (IC) Back End Of Line (BEOL) process corners, the apparatus including means for generating an output waveform with a frequency state; means for selecting the frequency state based on a plurality of ring oscillator stage time delays; and means for modifying the plurality of ring oscillator stage time delays through a coupling between a plurality of shield net stages and a plurality of ring oscillator stages.

In one example, the means for generating includes a plurality of ring oscillator interconnections, and wherein each of the plurality of ring oscillator interconnections is between two adjacent ring oscillator stages of the plurality of ring oscillator stages. In one example, each of the plurality of ring oscillator stage time delays includes a resistance and a capacitance of each of the plurality of ring oscillator interconnections. In one example, the IC BEOL process corners are based on resistance and capacitance values of the plurality of ring oscillator interconnections.

These and other aspects of the present disclosure will become more fully understood upon a review of the detailed description, which follows. Other aspects, features, and implementations of the present disclosure will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

BRIEF DESCRIPTION OF THE DRAWINGS

FIG. 6 illustrates an example process flow for sensing integrated circuit (IC) back end of line (BEOL) process corners.

DETAILED DESCRIPTION

Figure 1:
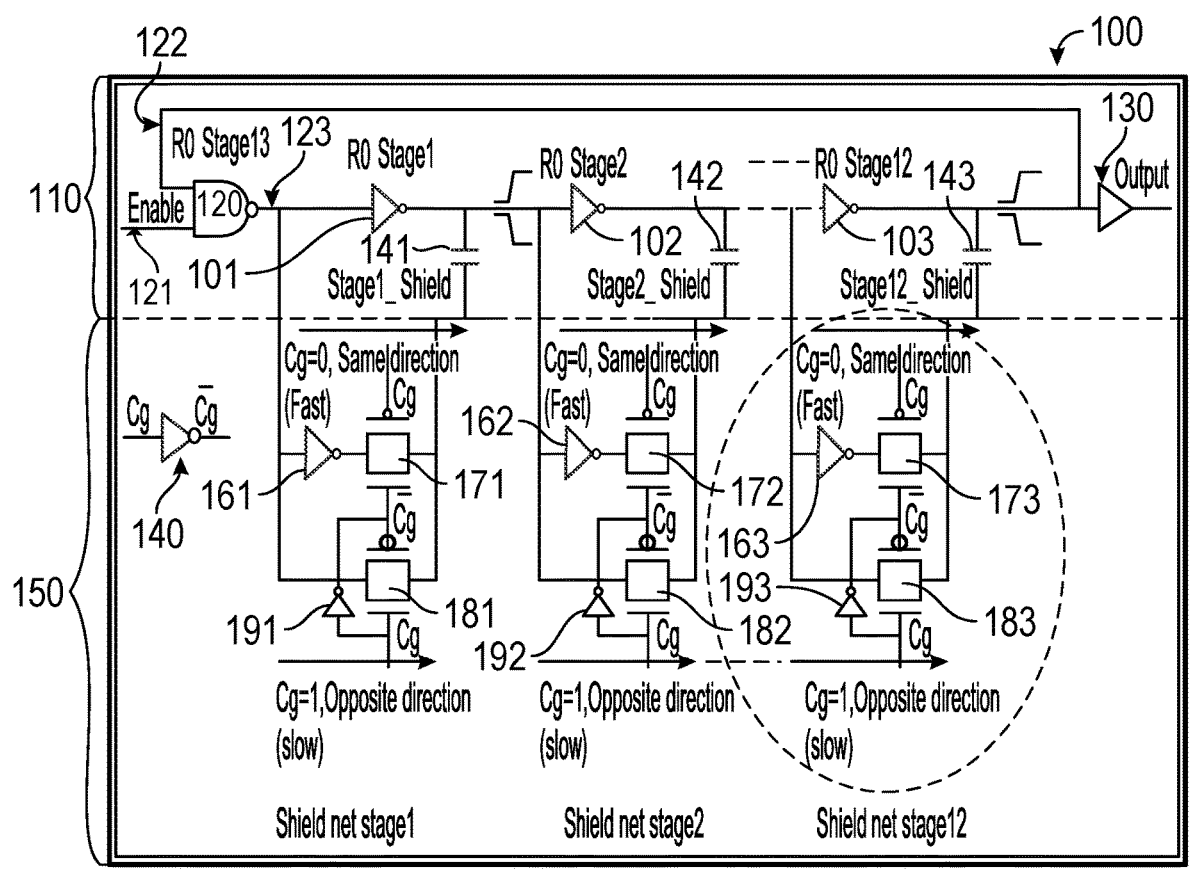
FIG. 1 illustrates an example of a ring oscillator/shield net circuit with integrated circuit (IC) back end of line (BEOL) process corner discrimination.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

The economics of integrated circuit (IC) production is such that maximum productivity is attained with IC designs having high yield, that is, IC designs with very high probability of zero defects after manufacturing. The probability of zero defects depends on characteristics of IC BEOL process corners. For example, IC BEOL process corners may be extreme design parameters (e.g., maximum or minimum RC time delay) which are sensitive to process variations (e.g., IC layout variances) and environmental effects (e.g., physical sensitivities to voltage, temperature, etc.). In addition, circuit performance at IC BEOL process corners may be used as a characterization technique to change performance.

ICs are used in diverse applications for both logical operations and storage operations in a wide variety of systems. Because of the extreme density of device integration in current ICs (e.g., as high as 100 million transistors per square millimeter), on-chip sensors are often placed onto the IC as a form of built-in self-test (BIST). BIST may be used to assess the integrity and performance of the IC under environmental variations and process variations. For example, BIST may be used to assess IC production yield or to characterize IC performance over various operational conditions.

In one example, IC production involves at least two production phases: a front end of line (FEOL) phase and a back end of line (BEOL) phase. For example, the FEOL phase may include initial manufacturing steps on a bare semiconductor wafer which forms the various IC layers and device regions. For example, the BEOL phase may include interconnection placement on the IC to route and connect the various IC layers and device regions. In one example, the FEOL phase may introduce FEOL variations and the BEOL phase may introduce BEOL variations. For example, the FEOL variations and the BEOL variations may result in performance or IC yield variations. The on-chip sensor may be designed to emphasize sensitivity to either FEOL variations or BEOL variations.

In one example, the BEOL variations may dominate over FEOL variations if the interconnection placement on the IC results in long routing such that transmission line time delays are greater than other time delays in the IC. In one example, the ring oscillator may be designed to monitor BEOL variations, for example, variations in interconnection time delay due to changes in transmission line (e.g., metal interconnection or metal wire) capacitance and resistance in the plurality of RO stages. In one example, the on-chip sensor sensitivity to BEOL transmission line capacitance and resistance may be realized using discrimination to RO frequency changes by inducing larger frequency variations in the RO.

For example, the BEOL phase may introduce BEOL variations (e.g., IC BEOL process corners) in interconnection time delay which may be characterized by at least five IC BEOL process corners: capacitance nominal (CN), capacitance worst (CW), resistance capacitance worst (RCW), capacitance best (CB) and resistance capacitance best (RCB). For example, the CN BEOL process corner may represent a nominal design point with nominal capacitance values. For example, the CW and CB BEOL process corners may represent a worst-case design point and a best-case design point, respectively, for transmission line capacitance values. For example, the RCW and RCB BEOL process corners may represent a worst-case design point and a best-case design point, respectively, for transmission line resistance-capacitance values. For example, the worst-case design point may be a slow process corner condition and the best-case design point may be a fast process corner condition.

In one example, a relative dispersion among the IC BEOL process corners, for example, CN, CW, RCW, CB, RCB, is increased for IC BEOL process corner discrimination. In one example, IC BEOL process corner discrimination may result in better design fidelity and a reduction in circuit margin due to uncertainties. For example, margin in core power reduction (CPR) voltage may be reduced which may result in dc power savings. In one example, CPR voltage is a characterized voltage required to meet a performance goal over all modes for the IC.

In one example, the sensitivity of an IC to process variations may be assessed using an on-chip sensor which characterizes IC BEOL process corners. For example, process variations in IC production which use the same IC process may result in performance or parameter variations (e.g., power level variations or reliability changes). IC BEOL process corners are IC performance operating points which represent extreme values of some relevant circuit parameter (e.g., resistance, capacitance, voltage, temperature, etc.). In one example, IC BEOL process corners may be monitored using the on-chip sensor. For example, the monitored IC BEOL process corners may be used to optimize voltage settings on the IC to modify circuit performance.

For example, one type of on-chip sensor commonly used is a ring oscillator (RO). For example, a ring oscillator may include a plurality of RO stages, each providing a time delay from an RO stage input to an RO stage output. By cascading an odd quantity of RO stages implemented as a cascade of inverters and with feedback from the last RO stage output to the first RO stage input, an output waveform (e.g., a square wave) may be generated by the RO with an RO frequency (in Hertz). For example, since the RO frequency depends on time delays of the plurality of RO stages, measurement of the RO frequency using, for example, a digital frequency counter, provides a direct measure of an average time delay of the plurality of RO stages implemented in the IC.

For example, a set of RO frequency measurements across a set of operational conditions may provide a comprehensive assessment of IC design margins. However, the accuracy of the IC design margin assessment may depend on the relative dispersion of the set of RO frequency measurements. That is, due to measurement uncertainties, each RO frequency measurement has some limited discrimination relative to other RO frequency measurements. And, disclosed herein is an on-chip sensor with better monitoring and discrimination of IC BEOL process corners.

For example, an RO with a shield net circuit may modify the RO frequency to generate a modified RO frequency which results in frequency discrimination among the various IC BEOL process corners. For example, the shield net circuit includes a plurality of shield net stages. In one example, the shield net circuit increases the frequency difference between two RO frequencies at two operational conditions for better IC BEOL process corner discrimination. In one example, the two operational conditions may be a fast process corner condition with higher RO frequency and a slow process corner condition with lower RO frequency. The modified RO frequency may be adjusted by means of capacitive coupling between the shield net stages and the ring oscillator stages. The shield net circuit may be toggled between two frequency states which either decreases or increases the time delays of the plurality of RO stages (RO stage time delays) and results in an output waveform with a higher or lower RO frequency. In one example, the two frequency states are a FAST frequency state which results in a high RO frequency and a SLOW frequency state which results in a low RO frequency, where the high RO frequency is greater than the low RO frequency. For example, each shield net stage time delay is matched to each RO stage time delay.

FIG. 1 illustrates an example of a ring oscillator/shield net circuit 100 with integrated circuit (IC) back end of line (BEOL) process corner discrimination. The ring oscillator/shield net circuit 100 includes a ring oscillator (RO) 110 and a shield net circuit 150. In one example, the ring oscillator (RO) 110 includes a plurality of RO stages. Shown in FIG. 1 are thirteen RO stages. One skilled in the art would understand that the quantity of RO stages may vary and still be within the spirit and scope of the present disclosure.

In one example, an RO stage includes an inverter coupled to a coupling capacitor. For example, a first RO stage (i.e., RO stage 1) includes a first inverter 101 and a first coupling capacitor 141, a second RO stage (i.e., RO stage 2) includes a second inverter 102 and a second coupling capacitor 142. Also shown in FIG. 1 is a twelfth RO stage (i.e., RO stage 12) which includes an inverter 103 and a coupling capacitor 143. In one example, a plurality of intermediate RO stages (i.e., RO stages 3 through RO stages 11) is positioned between the second RO stage (i.e., RO stage 2) and the twelfth RO stage (i.e., RO stage 12).

In one example, the ring oscillator (RO) 110 may include an enable input signal 121 which is a bilevel signal connected to a NAND gate 120. For example, the NAND gate 120 serves as a thirteenth RO stage (i.e., RO stage 13) of the ring oscillator (RO) 110. In one example, the NAND gate 120 has two inputs: the enable input 121 and a feedback input 122. In one example, the NAND gate 120 includes a NAND output 123.

In one example, if the signal on the enable input 121 is set LOW, the NAND gate 120 has a signal on the NAND output 123 set to HIGH, independent of the state of the signal from the feedback input 122. For example, when the signal on the enable input 121 is set HIGH, the NAND gate 120 has the signal on the NAND output 123 set to an inverse of the signal on the feedback input 122. For example, as the signal on the feedback input 122 toggles from LOW to HIGH, the signal on the NAND output 123 toggles from HIGH to LOW, if the signal on the enable input 121 is set HIGH. For example, as the signal on the feedback input 122 toggles from HIGH to LOW, the signal on the NAND output 123 toggles from LOW to HIGH, if the signal on the enable input 121 is set HIGH.

In one example, each RO stage has a stage time delay $\tau_i$, from its RO stage input to its RO stage output. For example, the stage time delay $\tau_i$, is a measure of time delay between an input signal state transition and an output signal state transition. For example, the state transition may be a change from a LOW state to a HIGH state or a change from a HIGH state to a LOW state. For example, the stage time delay $\tau_i$ for each RO stage includes a stage electronic time delay and a stage interconnection time delay. For example, the stage electronic time delay may be due to an inverter propagation delay in each RO stage. The stage electronic time delay may be due to capacitance in MOS transistors in the inverter, between a gate terminal and a source terminal or between the gate terminal and a drain terminal. For example, the stage interconnection time delay may be due to transmission line propagation delay due to transmission line capacitance and resistance in each RO stage.

In one example, a plurality of RO stage time delays $\tau_i$ for the plurality of RO stages results in an oscillation under two conditions: there are a quantity of (n+1) of RO stages where (n+1) is an odd integer and there is a feedback path from an output from a nth RO stage (e.g., RO stage n) to the feedback input 122 of a (n+1)th RO stage. In one example, the output from the nth RO stage (i.e., RO stage n) is coupled to an output buffer 130 which generates an output waveform with an oscillation frequency. The example shown in FIG. 1 has 13 RO stages and 12 shield net stages, wherein n is an even integer and (n+1) is an odd integer. One skilled in the art would understand that n can be any even integer and that the spirit and scope of the present disclosure is not confined to n equaling 12 as shown in the example of FIG. 1.

In one example, the output waveform is periodic with a period T determined by a reciprocal of the oscillation frequency. In one example, the oscillation is characterized by the oscillation frequency which is a count of the number of cycles per second (in Hertz). In one example, the oscillation frequency has an initial oscillation frequency $f_{osc}$ determined by an initial composite time delay $\tau_{osc}$ of the ring oscillator (RO) 110. For example, the initial oscillation frequency $f_{osc}$ is related to the initial composite time delay $\tau_{osc}$ via:

$$f_{osc}=\frac{1}{2}\tau_{osc}.$$

For example, the initial composite time delay $\tau_{osc}$ for an operational condition is equal to a sum of the plurality of RO stage time delays $\tau_i$. In one example, the ring oscillator (RO) 110 includes a quantity of M RO stages. An ith RO stage may have stage time delay $\tau_i$. In one example, the initial composite time delay $\tau_{osc}$ is given by:

$$\tau_{osc}=\Sigma\tau_i$$

where the summation ranges from i=1 to M. For example, if each stage time delay $\tau_i$ is the same (i.e., $\tau_i=\tau_0$), the initial composite time delay $\tau_{osc}$ simplifies to:

$$\tau_{osc}=M\tau_0$$

and the initial oscillation frequency $f_{osc}$ simplifies to:

$$f_{osc}=\frac{1}{2}M\tau_0.$$

In one example, the initial composite time delay $\tau_{osc}$ of the ring oscillator (RO) 110 for an operational condition may be modified by coupling from a shield net circuit 150 to yield a modified time delay $\tau_{mod}$. For example, the oscillation frequency changes from the initial oscillation frequency $f_{osc}=\frac{1}{2}T_{osc}$ to a modified oscillation frequency $f_{mod}=\frac{1}{2}\tau_{mod}$. In one example, the coupling may introduce an inphase current. In another example, the coupling may introduce an out of phase current. In one example, the modified time delay $\tau_{mod}$ may be greater than or less than the initial composite time delay $\tau_{osc}$. For example, if the coupling from the shield net circuit 150 introduces an inphase current, then the modified time delay $\tau_{mod}$ may be less than the initial composite time delay $\tau_{osc}$ and the oscillation frequency increases. For example, if the coupling from the adjacent circuit introduces an out of phase current, then the modified time delay $\tau_{mod}$ may be greater than the initial composite time delay $\tau_{osc}$ and the oscillation frequency decreases.

In one example, the shield net circuit 150 includes a quantity n of a plurality of shield net stages coupled to a quantity of n of the plurality of (n+1) RO stages of the ring oscillator (RO) 110. In other words, there is one shield net stage for each RO stage, except the last RO stage (i.e., the (n+1)$^{th}$ RO stage). In one example, the ring oscillator (RO) 110 may be implemented with one more RO stage than the number of shield net stages. In another example, the RO 110 may be implemented with an equal number of RO stages and shield net stages.

For example, each shield net stage includes an inverter path and a through path. The inverter path may generate an inphase current destined to an RO stage via a coupled path and the through path may generate an out-of-phase current destined to the RO stage via the coupled path. For example, the coupled path is connected to a coupling capacitor of one of the plurality of RO stages of the ring oscillator (RO) 110. In one example, the coupling capacitor may be implemented as two metal parallel strips in the integrated circuit (IC). For example, each RO stage and each shield net stage may be modeled as a pi (π) network (e.g., Resistance-Capacitance (RC) network) with a coupling capacitor at an input of the pi (π) network and at an output of the pi (π) network.

For example, each one of the plurality of shield net stages has a time delay which is matched to a stage time delay $\tau_i$ of each one of the plurality of RO stages of the ring oscillator (RO) 110. In one example, a time delay of the inverter path of each shield net stage and a time delay of the through path of each shield net stage are substantially matched to each stage time delay $\tau_i$ of the RO stages of the ring oscillator (RO) 110.

At least one PMOS transistor and at least one NMOS transistor are within the inverter transmission gate 171, 172, 173. At least one PMOS transistor and at least one NMOS transistor are within the through transmission gate 181, 182, 183. In the present disclosure, the at least one PMOS transistor and at least one NMOS transistor are not shown in FIG. 1. Each of the PMOS transistors has a gate terminal, a source terminal and a drain terminal. The gate terminal, the source terminal and the drain terminal of each of the PMOS transistors are not shown in FIG. 1. Each of the NMOS transistors has a gate terminal, a source terminal and a drain terminal. The gate terminal, the source terminal and the drain terminal of each of the NMOS transistors are not shown in FIG. 1.

In one example, each shield net stage includes an inverter transmission gate 171, 172, 173 in the inverter path and a through transmission gate 181, 182, 183 in the through path. In one example, a through transmission gate 181, 182, 183 includes at least one PMOS transistor (not shown) and at least one NMOS transistor (not shown). For example, each transmission gate has two control inputs, a PMOS control input connected to a gate terminal of the at least one PMOS transistor (not shown) and a NMOS control input connected to a gate terminal of the at least one NMOS transistor (not shown). For example, a source terminal of the at least one PMOS transistor (not shown) and a source terminal of the at least one NMOS transistor (not shown) are shorted together and serve as an input for the transmission gate. For example, a drain terminal of the at least one PMOS transistor (not shown) and a drain terminal of the at least one NMOS transistor (not shown) are shorted together and serve as an output for the transmission gate.

For example, the inverter transmission gate 171, 172, 173 has two control inputs: an inverter PMOS control input and an inverter NMOS control input. For example, the inverter transmission gate 171, 172, 173 has an inverter path input connected to an inverter output of inverter 161, 162, 163 and an inverter path output connected to the coupled path. For example, the through transmission gate 181, 182, 183 has two control inputs: a through PMOS control input and a through NMOS control input. For example, the through transmission gate has a through path input connected to an inverter input of inverter 161, 162, 163 and a through path output connected to the coupled path.

In one example, if the inverter PMOS control input is LOW and the inverter NMOS control input is HIGH, then the inverter transmission gate 171, 172, 173 is placed into a BLOCKED state and the inverter path input is disconnected from the inverter path output. If the inverter PMOS control input is HIGH and the inverter NMOS control input is LOW, then the inverter transmission gate 171, 172, 173 is placed into a CONNECTED state and the inverter path input is connected to the inverter path output.

In one example, if the through PMOS control input is LOW and the through NMOS control input is HIGH, then the through transmission gate 181, 182, 183 is placed into a BLOCKED state and the through path input is disconnected from the through path output. If the through PMOS control input is HIGH and the through NMOS control input is LOW, then the through transmission gate 181, 182, 183 is placed into a CONNECTED state and the through path input is connected to the through path output.

In one example, the shield net circuit 150 may be toggled between two frequency states which either decreases or increases the time delays of the plurality of RO stages (RO stage time delays) and results in a high or low RO frequency. In one example, the frequency state is a circuit condition which results in a particular RO frequency. In one example, the frequency state may be controlled (i.e., toggled) by a control signal.

In one example, the two frequency states are a first frequency state with a first frequency and a second frequency state with a second frequency. In one example, the first frequency state is a FAST frequency state with the first frequency equal to a high RO frequency for a fast process corner condition and the second frequency state is a SLOW frequency state with the second frequency equal to a low RO frequency for a slow process corner condition, where the high RO frequency is greater than the low RO frequency. For example, the frequency difference with the shield net circuit 150 coupled to the ring oscillator (RO) 110 may be several times larger than the frequency difference without the shield net circuit 150. In one example, the frequency difference with the shield net circuit 150 coupled to the ring oscillator (RO) 110 is a difference between a first frequency of a first frequency state and a second frequency of a second frequency state.

For example, the first frequency state is the FAST frequency state with the shield net circuit 150 coupled to the ring oscillator (RO) 110 and the second frequency state is the SLOW frequency state with the shield net circuit 150 coupled to the ring oscillator (RO) 110. In one example, the frequency difference without the shield net circuit 150 is a difference between a value of the first intrinsic frequency of a first intrinsic frequency state and a value of the second intrinsic frequency of a second intrinsic frequency state. In one example, an intrinsic frequency is a frequency of the ring oscillator (RO) 110 without influence (or without coupling) from the shield net circuit 150.

In one example, the first intrinsic frequency state without the shield net circuit 150 is analogous to the FAST frequency state with the shield net circuit 150 coupled to the ring oscillator (RO) 110 for a fast process corner condition. In one example, the second intrinsic frequency state without the shield net circuit 150 is analogous to the SLOW frequency state with the shield net circuit 150 coupled to the ring oscillator (RO) 110 for a slow process corner condition.

In one example, the frequency state is either the first frequency state or the second frequency state, where the first frequency of the first frequency state is greater than the first intrinsic frequency of the first intrinsic frequency state, and the second frequency of the second frequency state is less than the second intrinsic frequency of the second intrinsic frequency state. In one example, the first frequency state and second frequency state depend on the shield net circuit 150. And, in one example, the first intrinsic frequency state and second intrinsic frequency state are independent of the shield net circuit 150 since the first intrinsic frequency and the second intrinsic frequency are frequencies of the ring oscillator (RO) 110 without influence (or without coupling) from the shield net circuit 150.

For example, each shield net stage time delay is substantially matched to a corresponding RO stage time delay. For example, the shield net circuit 150 accepts a toggle signal at a toggle input to toggle the frequency state. In one example, the toggle between the two frequency states may be controlled by a control signal Cg and a complement control signal Cg_bar which are sent to each shield net stage. For example, the control signal Cg and the complement control signal Cg_bar are bilevel signals which specify the two frequency states. In one example, the complement control signal Cg_bar may be generated from the control signal Cg using inverter 140 as a complementing device (i.e., to change a bilevel status level). In one example, the toggle input accepts the control signal Cg. For example, inverter 140 has a toggle input to accept the control signal Cg.

For example, a first shield net stage (i.e., shield net stage 1) includes a first inverter path with a first inverter 161 and a first inverter transmission gate 171 and a first through path with a first through transmission gate 181. In one example, the first inverter transmission gate 171 includes a first inverter PMOS control input and a first inverter NMOS control input. For example, the first inverter PMOS control input accepts the control signal Cg with bilevel states LOW and HIGH (i.e., 0 and 1). For example, the first inverter NMOS control input accepts the complement control signal Cg_bar with bilevel states LOW and HIGH (i.e., 0 and 1).

In one example, the first through transmission gate 181 includes a first through PMOS control input and a first through NMOS control input. For example, the first through PMOS control input accepts the complement control signal Cg_bar with bilevel states LOW and HIGH (i.e., 0 and 1). For example, the first through NMOS control input accepts the control signal Cg with bilevel states LOW and HIGH (i.e., 0 and 1).

In one example, if the control signal Cg is LOW and the complement control signal Cg_bar is HIGH, then the first inverter PMOS control input is LOW and the first inverter NMOS control input is HIGH which results in the first inverter transmission gate 171 in a BLOCKED state. In one example, if the control signal Cg is LOW and the complement control signal Cg_bar is HIGH, then the first through PMOS control input is HIGH and the first through NMOS control input is LOW which results in the first through transmission gate 181 in a CONNECTED state. In one example, the first through path produces an inphase current destined to the first RO stage (i.e., RO stage 1) via a first coupled path. For example, the first coupled path is connected to the first coupling capacitor 141 of the first RO stage (i.e., RO stage 1) of the ring oscillator (RO) 110.

In one example, if the control signal Cg is HIGH and the complement control signal Cg_bar is LOW, then the first inverter PMOS control input is HIGH and the first inverter NMOS control input is LOW which results in the first inverter transmission gate 171 in a CONNECTED state. In one example, if the control signal Cg is HIGH and the complement control signal Cg_bar is LOW, then the first through PMOS control input is LOW and the first through NMOS control input is HIGH which results in the first through transmission gate 181 in a BLOCKED state. In one example, the first inverter path produces an out of phase current destined to the first RO stage (i.e., RO stage 1) via the first coupled path. For example, the first coupled path is connected to the first coupling capacitor 141 of the first RO stage (i.e., RO stage 1) of the ring oscillator (RO) 110.

In one example, if the control signal Cg is LOW and the complement control signal Cg_bar is HIGH, then the first through transmission gate 181 is in a CONNECTED state and the first through path produces a first inphase current destined to the first coupling capacitor 141 of the first RO stage (i.e., RO stage 1) of the ring oscillator (RO) 110. In one example, the first inphase current reduces the first stage time delay $\tau_1$ and modifies the modified time delay $T_{mod}$ to a value less than the initial composite time delay $T_{osc}$ such that the oscillation frequency increases to a value greater than the initial oscillation frequency $f_{osc}$.

In one example, if the control signal Cg is HIGH and the complement control signal Cg_bar is LOW, then the first inverter transmission gate 171 is in a CONNECTED state and the first inverter path produces a first out of phase current destined to the first coupling capacitor 141 of the first RO stage (i.e., RO stage 1) of the ring oscillator (RO) 110. In one example, the first out of phase current increases the first stage time delay $\tau_1$ and modifies the modified time delay $\tau_{mod}$ to a value greater than the initial composite time delay $\tau_{osc}$ such that the oscillation frequency decreases to a value less than the initial oscillation frequency $f_{osc}$.

For example, a second shield net stage (i.e., shield net stage 2) includes a second inverter path with a second inverter 162 and a second inverter transmission gate 172 and a second through path with a second through transmission gate 182. In one example, the second inverter transmission gate 172 includes a second inverter PMOS control input and a second inverter NMOS control input. For example, the second inverter PMOS control input accepts a control signal Cg with bilevel states LOW and HIGH (i.e., 0 and 1). For example, the second inverter NMOS control input accepts a complement control signal Cg_bar with bilevel states LOW and HIGH (i.e., 0 and 1).

In one example, the second through transmission gate 182 includes a second through PMOS control input and a second through NMOS control input. For example, the second through PMOS control input accepts the complement control signal Cg_bar with bilevel states LOW and HIGH (i.e., 0 and 1). For example, the second through NMOS control input accepts the control signal Cg with bilevel states LOW and HIGH (i.e., 0 and 1).

In one example, if the control signal Cg is LOW and the complement control signal Cg_bar is HIGH, then the second inverter PMOS control input is LOW and the second inverter NMOS control input is HIGH which results in the second inverter transmission gate 172 in a BLOCKED state. In one example, if the control signal Cg is LOW and the complement control signal Cg_bar is HIGH, then the second through PMOS control input is HIGH and the second through NMOS control input is LOW which results in the second through transmission gate 182 in a CONNECTED state. In one example, the second through path produces an inphase current destined to the second RO stage via a second coupled path. For example, the second coupled path is connected to the second coupling capacitor 142 of the second RO stage (i.e., RO stage 2) of the ring oscillator (RO) 110.

In one example, if the control signal Cg is HIGH and the complement control signal Cg_bar is LOW, then the second inverter PMOS control input is HIGH and the second inverter NMOS control input is LOW which results in the second inverter transmission gate 172 in a CONNECTED state. In one example, if the control signal Cg is HIGH and the complement control signal Cg_bar is LOW, then the second through PMOS control input is LOW and the second through NMOS control input is HIGH which results in the second through transmission gate 182 in a BLOCKED state. In one example, the second inverter path produces an out of phase current destined to the second RO stage via the second coupled path. For example, the second coupled path is connected to the second coupling capacitor 142 of the second RO stage (i.e., RO stage 2) of the ring oscillator (RO) 110.

In one example, if the control signal Cg is LOW and the complement control signal Cg_bar is HIGH, then the second through transmission gate 182 is in a CONNECTED state and the second through path produces a second inphase current destined to the second coupling capacitor 142 of the second RO stage (i.e., RO stage 2) of the ring oscillator (RO) 110. In one example, the second inphase current reduces the second stage time delay $\tau_1$ and modifies the modified time delay $\tau_{mod}$ to a value less than the initial composite time delay $\tau_{osc}$ such that the oscillation frequency increases to a value greater than the initial oscillation frequency $f_{osc}$.

In one example, if the control signal Cg is HIGH and the complement control signal Cg_bar is LOW, then the second inverter transmission gate 172 is in a CONNECTED state and the second inverter path produces a second out of phase current destined to the second coupling capacitor 142 of the second RO stage (i.e., RO stage 2) of the ring oscillator (RO) 110. In one example, the second out of phase current increases the second stage time delay $\tau_1$ and modifies the modified time delay $\tau_{mod}$ to a value greater than the initial composite time delay $\tau_{osc}$ such that the oscillation frequency decreases to a value less than the initial oscillation frequency $f_{osc}$.

For example, a twelfth shield net stage includes a twelfth inverter path with a twelfth inverter 163 and a twelfth inverter transmission gate 173 and a twelfth through path with a twelfth through transmission gate 183. In one example, the twelfth inverter transmission gate 173 includes a twelfth inverter PMOS control input and a twelfth inverter NMOS control input. For example, the twelfth inverter PMOS control input accepts a control signal Cg with bilevel states LOW and HIGH (i.e., 0 and 1). For example, the twelfth inverter NMOS control input accepts a complement control signal Cg_bar with bilevel states LOW and HIGH (i.e., 0 and 1).

In one example, the twelfth through transmission gate 183 includes a twelfth through PMOS control input and a twelfth through NMOS control input. For example, the twelfth through PMOS control input accepts the complement control signal Cg_bar with bilevel states LOW and HIGH (i.e., 0 and 1). For example, the twelfth through NMOS control input accepts the control signal Cg with bilevel states LOW and HIGH (i.e., 0 and 1).

In one example, if the control signal Cg is LOW and the complement control signal Cg_bar is HIGH, then the twelfth inverter PMOS control input is LOW and the twelfth inverter NMOS control input is HIGH which results in the twelfth inverter transmission gate 173 in a BLOCKED state. In one example, if the control signal Cg is LOW and the complement control signal Cg_bar is HIGH, then the twelfth through PMOS control input is HIGH and the twelfth through NMOS control input is LOW which results in the twelfth through transmission gate 183 in a CONNECTED state. In one example, the twelfth through path produces an inphase current destined to the twelfth RO stage via a twelfth coupled path. For example, the twelfth coupled path is connected to the twelfth coupling capacitor 143 of the twelfth RO stage (i.e., RO stage 12) of the ring oscillator (RO) 110.

In one example, if the control signal Cg is HIGH and the complement control signal Cg_bar is LOW, then the twelfth inverter PMOS control input is HIGH and the twelfth inverter NMOS control input is LOW which results in the twelfth inverter transmission gate 173 in a CONNECTED state. In one example, if the control signal Cg is HIGH and the complement control signal Cg_bar is LOW, then the twelfth through PMOS control input is LOW and the twelfth through NMOS control input is HIGH which results in the twelfth through transmission gate 183 in a BLOCKED state. In one example, the twelfth inverter path produces an out of phase current destined to the twelfth RO stage via the twelfth coupled path. For example, the twelfth coupled path is connected to the twelfth coupling capacitor 143 of the twelfth RO stage (i.e., RO stage 12) of the ring oscillator (RO) 110.

In one example, if the control signal Cg is LOW and the complement control signal Cg_bar is HIGH, then the twelfth through transmission gate 183 is in a CONNECTED state and the twelfth through path produces a twelfth inphase current destined to the twelfth coupling capacitor 143 of the twelfth RO stage (i.e., RO stage 12) of the ring oscillator (RO) 110. In one example, the twelfth inphase current reduces the twelfth stage time delay $\tau_1$ and modifies the modified time delay $\tau_{mod}$ to a value less than the initial composite time delay $\tau_{osc}$ such that the oscillation frequency increases to a value greater than the initial oscillation frequency $f_{osc}$.

In one example, if the control signal Cg is HIGH and the complement control signal Cg_bar is LOW, then the twelfth inverter transmission gate 173 is in a CONNECTED state and the twelfth inverter path produces a twelfth out of phase current destined to the twelfth coupling capacitor 143 of the twelfth RO stage (i.e., RO stage 12) of the ring oscillator (RO) 110. In one example, the twelfth out of phase current increases the twelfth stage time delay $\tau_1$ and modifies the modified time delay $\tau_{mod}$ to a value greater than the initial composite time delay $\tau_{osc}$ such that the oscillation frequency decreases to a value less than the initial oscillation frequency $f_{osc}$.

In one example, a plurality of intermediate shield net stages is positioned between the second shield net stage (i.e., shield net stage 2) and the twelfth shield net stage (i.e., shield net stage 12). For example, the plurality of intermediate shield net stages may be a quantity of nine shield net stages, labeled a third shield net stage (i.e., shield net stage 3) through an eleventh shield net stage (i.e., shield net stage 11).

In some implementations, the intermediate shield net stages are substantially the same. For example, each intermediate shield net stage includes an inverter path with an inverter and an inverter transmission gate and a through path with a through transmission gate.

In one example, if the control signal Cg is LOW and the complement control signal Cg_bar is HIGH, then each through transmission gate in each intermediate shield net stage is in a CONNECTED state and its corresponding through path produces a corresponding inphase current destined to the corresponding coupling capacitor of the corresponding RO stage of the ring oscillator (RO) 110. In one example, the corresponding inphase current reduces the corresponding stage time delay $\tau_1$ and modifies the modified time delay $\tau_{mod}$ to a value less than the initial composite time delay $\tau_{osc}$ such that the oscillation frequency increases to a value greater than the initial oscillation frequency $f_{osc}$.

In one example, if the control signal Cg is HIGH and the complement control signal Cg_bar is LOW, then each inverter transmission gate in each intermediate shield net stage is in a CONNECTED state and its corresponding inverter path produces a corresponding out of phase current destined to the corresponding coupling capacitor of the corresponding RO stage of the ring oscillator (RO) 110. In one example, the corresponding out of phase current increases the corresponding stage time delay $\tau_1$ and modifies the modified time delay $\tau_{mod}$ to a value greater than the initial composite time delay $\tau_{osc}$ such that the oscillation frequency decreases to a value less than the initial oscillation frequency $f_{osc}$.

Figure 2:
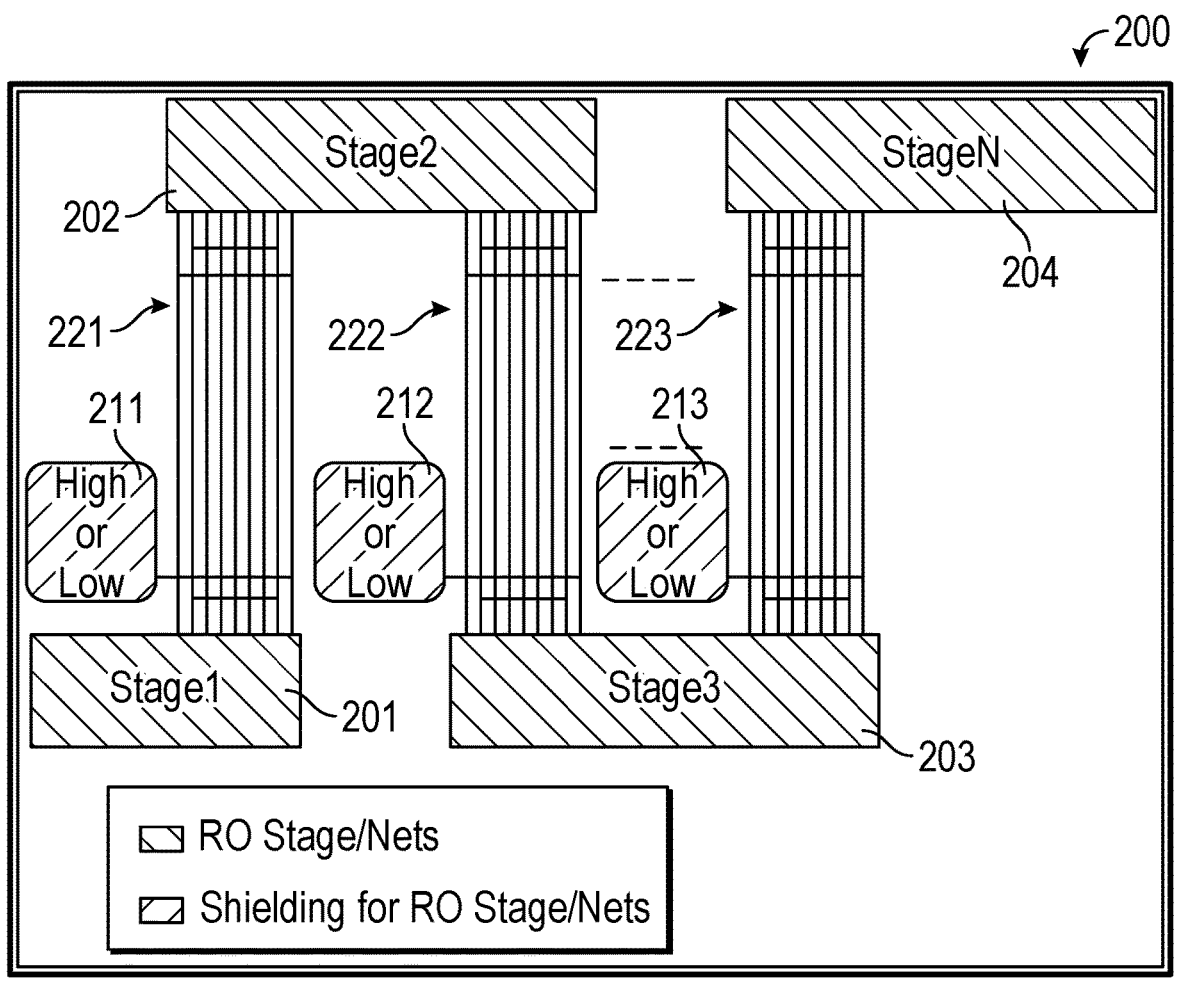
FIG. 2 illustrates an example schematic layout for the ring oscillator/shield net circuit of FIG. 1.

FIG. 2 illustrates an example schematic layout 200 for the ring oscillator/shield net circuit 100 of FIG. 1. Shown, for example, are a first RO stage 201, a second RO stage 202, a third RO stage 203 and an nth RO stage 204. In one example, other RO stages, denoted here as intermediate RO stages may be introduced into the schematic layout of FIG. 2. Also shown, for example, are a first interconnection net 221, a second interconnection net 222, a third interconnection net 223, etc. which sequentially interconnect two adjacent RO stages. Also shown, for example, are a first shield net stage 211 coupled to the first RO stage 201, a second shield net stage 212 coupled to the second RO stage 202, a third shield net stage 213 coupled to the third RO stage 203. In one example, each RO stage net is coupled to a shield net circuit. In one example, each RO stage may be routed over a distance of 15 um and may include 4 interconnections to each shield net stage. In one example, each shield net stage may be toggled by control signal Cg.

Figure 3:
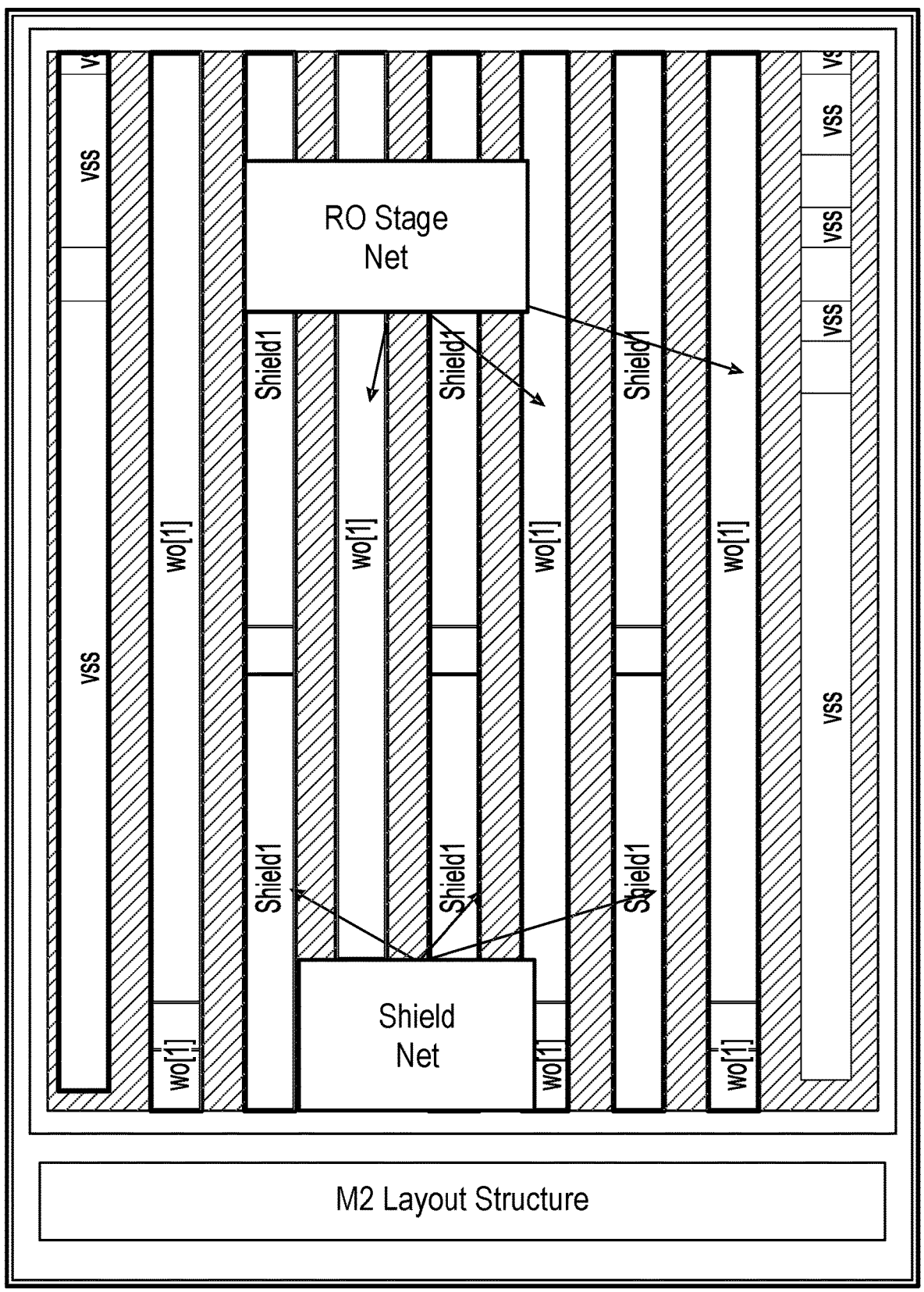
FIG. 3 illustrates an example metal layer layout structure for the ring oscillator/shield net circuit of FIG. 1.

FIG. 3 illustrates an example metal layer layout structure 300 for the ring oscillator/shield net circuit 100 of FIG. 1. Shown is an interconnection net which includes RO interconnections and shield net interconnections. In one example, the interconnection net for a RO stage is laid out on the IC adjacent to the RO stage and adjacent to the shield net stage coupled to the RO stage.

Figure 4:
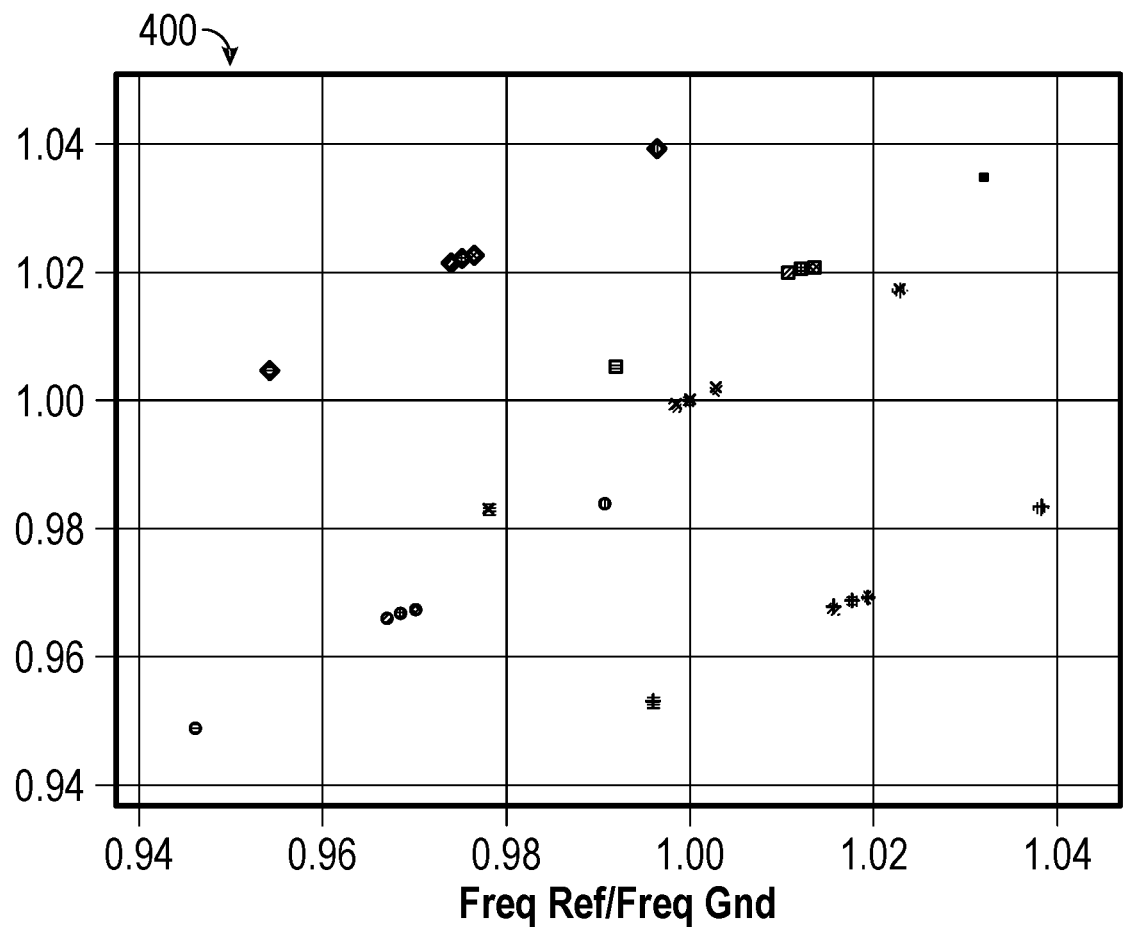
FIG. 4 illustrates an example performance graph for a ring oscillator.

FIG. 4 illustrates an example performance graph 400 for a ring oscillator. In one example, in FIG. 4, slow frequency process corners and fast frequency process corners from a BEOL ring oscillator design are plotted in a two-dimensional graph with a fast ratio on the horizontal axis and a slow ratio on the vertical axis. For example, each graph shows all FEOL and BEOL process corners normalized to a reference process corner, labeled as cn_tt (i.e. capacitance nominal, typical/typical). The legend box of FIG. 4 includes the following: FEOL=front end of line; ffg=fast/fast/global; fsg=fast/slow/global; sfg=slow/fast/global; ssg=slow/slow/global; tt=typical/typical; BEOL=back end of line; cb_ccb=capacitance best_chip-chip best; cn=capacitance nominal; cw_ccw=capacitance worst_chip-chip worst; rcb_ccb=resistance capacitance best_chip-chip best; rcw_ccw=resistance capacitance worst_chip-chip worst.

Figure 5:
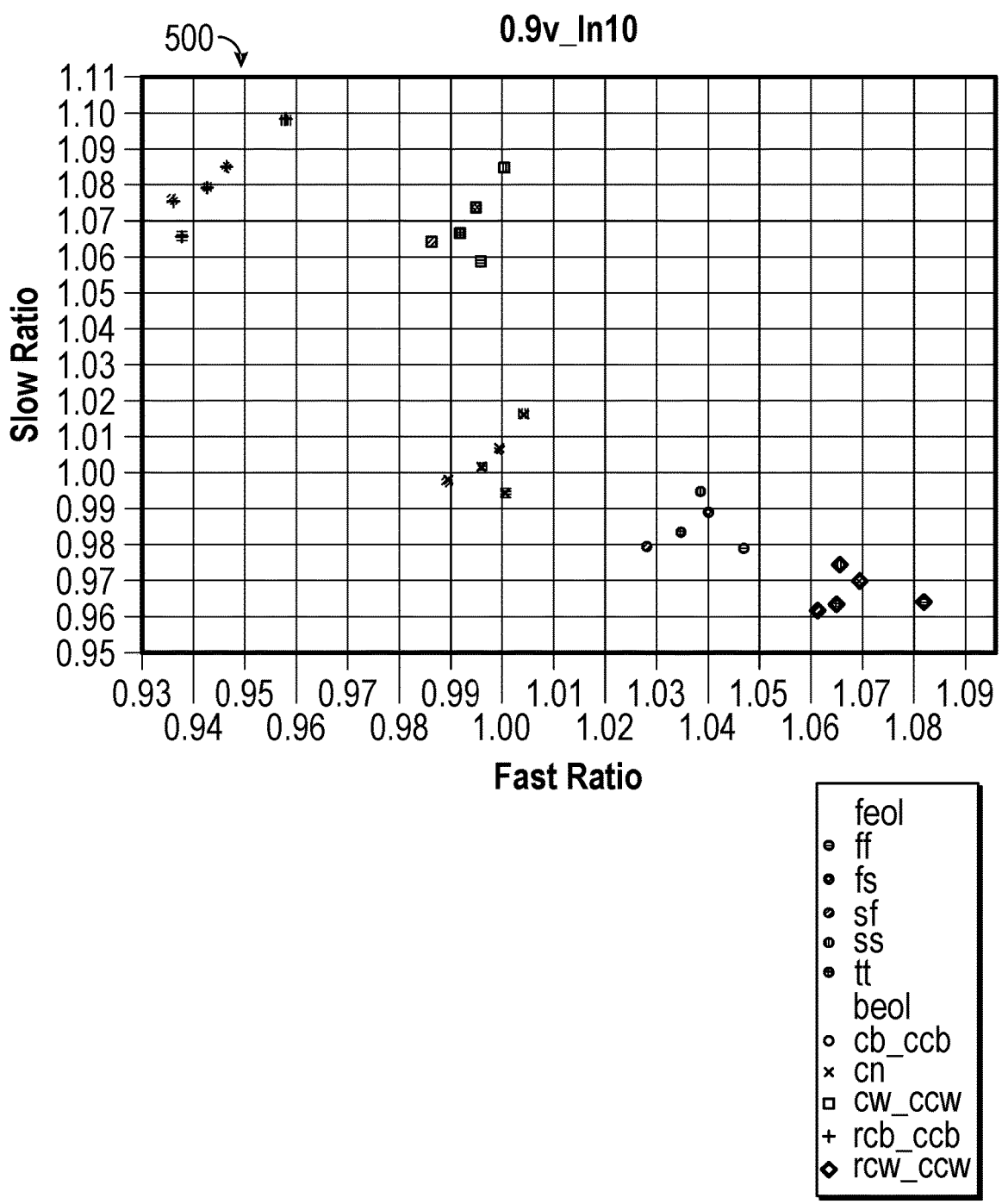
FIG. 5 illustrates an example performance graph for a ring oscillator/shield net circuit.

FIG. 5 illustrates an example performance graph 500 for a ring oscillator/shield net circuit. In one example, in FIG. 5, slow frequency process corners and fast frequency process corners from a BEOL ring oscillator design are plotted in a two-dimensional graph with a fast ratio on the horizontal axis and a slow ratio on the vertical axis. For example, each graph shows all FEOL and BEOL process corners normalized to a reference process corner, labeled as cn_tt (i.e., capacitance nominal, typical/typical). The legend box of FIG. 5 includes the following: FEOL=front end of line; ff=fast/fast; fs=fast/slow; sf=slow/fast; ss=slow/slow; tt=typical/typical; BEOL=back end of line; cb_ccb=capacitance best_chip-chip best; cn=capacitance nominal; cw_ccw=capacitance worst_chip-chip worst; rcb_ccb=resistance capacitance best_chip-chip best; rcw_ccw=resistance capacitance worst_chip-chip worst.

In one example, FIG. 5 shows improved discrimination compared to FIG. 4 for BEOL process corners (e.g., CN, CW, CB, RCW, RCB) which may allow a reduction in circuit margin (e.g., voltage margin). In one example, a frequency ratio is defined as a ratio of unloaded frequency to loaded frequency, where loaded frequency is a characteristic of an RO designed as BEOL-dominated and unloaded frequency is a characteristic of an RO designed as FEOL-dominated. For example, in FIG. 4 and FIG. 5 an unloaded RO ratio (related to FEOL process corners) is shown for both horizontal and vertical axes to cancel gate time delays.

FIG. 6 illustrates an example process flow 600 for sensing integrated circuit (IC) back end of line (BEOL) process corners. In block 610, an output waveform with a frequency state is generated using a ring oscillator (RO), wherein the ring oscillator (RO) includes a plurality of ring oscillator (RO) stages. In one example, the ring oscillator (RO) includes a plurality of RO stages and a plurality of RO stage time delays. In one example, the ring oscillator (RO) includes a plurality of ring oscillator interconnections. Each of the plurality of ring oscillator interconnections is between two adjacent ring oscillator stages of the plurality of ring oscillator stages. In one example, each RO stage time delay includes a resistance and a capacitance of each of the plurality of ring oscillator interconnections. In one example, the IC process corners are based on resistance and capacitance values of the plurality of ring oscillator interconnections.

In block 620, a plurality of ring oscillator (RO) stage time delays is modified through a coupling between a plurality of shield net stages and the plurality of ring oscillator (RO) stages. In one example, each of the plurality of RO stage time delays is a resistance capacitance (RC) time delay. In one example, the coupling is capacitive coupling. In one example, the frequency state is based on a match between the plurality of RO stage time delays and a plurality of time delays of the plurality of shield net stages.

In block 630, the frequency state is selected using a toggle input of a shield net circuit, wherein the shield net circuit includes the plurality of shield net stages. In one example, the toggle input accepts a normal control input Cg. In one example, the toggle input includes a bilevel state. In one example, setting the bilevel state of the toggle input is used to select the frequency state. In one example, the shield net circuit includes the plurality of shield net stages. In one example, the frequency state is either a first frequency state or a second frequency state, where a value of the first frequency state is greater than a value of a first intrinsic frequency state, and a value of the second frequency state is less than a value of a second intrinsic frequency state; and wherein the value of the first intrinsic frequency state and the value of the second intrinsic frequency state are independent of the shield net. In one example, the frequency state provides sensing discrimination among the IC process corners based on the coupling between the plurality of shield net stages and the plurality of RO stages.

In one aspect, one or more of the steps for sensing integrated circuit (IC) back end of line (BEOL) process corners in FIG. 6 may be executed by one or more processors which may include hardware, software, firmware, etc. In one aspect, one or more of the steps in FIG. 6 may be executed by one or more processors which may include hardware, software, firmware, etc. The one or more processors, for example, may be used to execute software or firmware needed to perform the steps in the flow diagram of FIG. 6. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in a processing system, external to the processing system, or distributed across multiple entities including the processing system. The computer-readable medium may be embodied in a computer program product. By way of example, a computer program product may include a computer-readable medium in packaging materials. The computer-readable medium may include software or firmware for sensing integrated circuit (IC) back end of line (BEOL) process corners. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The invention claimed is:

1. An apparatus for sensing integrated circuit (IC) Back End Of Line (BEOL) process corners, the apparatus comprising:
    a ring oscillator comprising a plurality of ring oscillator stages configured to generate an output waveform with a frequency state;
    a plurality of ring oscillator interconnections; and
    a shield net circuit comprising a plurality of shield net stages corresponding to the plurality of ring oscillator stages, the shield net circuit having a toggle input configured to receive a control signal Cg, wherein the IC BEOL process corners are based on resistance values and capacitance values of the plurality of ring oscillator interconnections.

2. The apparatus of claim 1, wherein the frequency state is either a first frequency state or a second frequency state; wherein a value of the first frequency state is greater than a value of a first intrinsic frequency state, and a value of the second frequency state is less than a value of a second intrinsic frequency state; and wherein the value of the first intrinsic frequency state and the value of the second intrinsic frequency state are independent of the shield net circuit.

3. The apparatus of claim 1, wherein the plurality of ring oscillator stages has a plurality of ring oscillator stage time delays which include resistance capacitance (RC) time delays.

4. The apparatus of claim 3, wherein each of the plurality of ring oscillator interconnections is between two adjacent ring oscillator stages of the plurality of ring oscillator stages.

5. The apparatus of claim 1, wherein a coupling exists between each of the plurality of shield net stages and its corresponding one of the plurality of ring oscillator stages.

6. The apparatus of claim 5, wherein the coupling is a capacitive coupling.

7. The apparatus of claim 1, wherein the toggle input includes a bilevel state.

8. The apparatus of claim 7, wherein the toggle input is configurable to set the frequency state based on the bilevel state.

9. The apparatus of claim 1, wherein the toggle input is configurable to select the frequency state by modifying a plurality of ring oscillator stage time delays through a coupling between the plurality of shield net stages and the plurality of ring oscillator stages.

10. The apparatus of claim 1, further comprising an additional ring oscillator stage coupled to the plurality of ring oscillator stages, wherein the plurality of ring oscillator stages is an even quantity.

11. A method for sensing integrated circuit (IC) Back End Of Line (BEOL) process corners, the method comprising:
    generating an output waveform with a frequency state using a ring oscillator, wherein the ring oscillator comprises a plurality of ring oscillator stages and a plurality of ring oscillator interconnections;
    modifying a plurality of ring oscillator stage time delays through a coupling between a plurality of shield net stages and the plurality of ring oscillator stages; and
    selecting the frequency state using a toggle input of a shield net circuit, wherein the shield net circuit comprises the plurality of shield net stages, wherein the IC BEOL process corners are based on resistance values and capacitance values of the plurality of ring oscillator interconnections.

12. The method of claim 11, wherein the frequency state is either a first frequency state or a second frequency state; wherein a value of the first frequency state is greater than a value of a first intrinsic frequency state, and a value of the second frequency state is less than a value of a second intrinsic frequency state; and wherein the value of the first intrinsic frequency state and the value of the second intrinsic frequency state are independent of the shield net circuit.

13. The method of claim 12, wherein each of the plurality of ring oscillator stage time delays is a resistance capacitance (RC) time delay.

14. The method of claim 13, wherein each of the plurality of ring oscillator interconnections is between two adjacent ring oscillator stages of the plurality of ring oscillator stages.

15. The method of claim 11, wherein the coupling is capacitive coupling.

16. The method of claim 11, wherein the toggle input includes a bilevel state.

17. The method of claim 16, further comprising setting the bilevel state of the toggle input to set the frequency state.

18. The method of claim 11, wherein the frequency state provides sensing discrimination among the IC BEOL process corners based on the coupling between the plurality of shield net stages and the plurality of ring oscillator stages.

19. The method of claim 18, wherein the frequency state is based on a match between the plurality of ring oscillator stage time delays and a plurality of time delays of the plurality of shield net stages.

20. An apparatus for sensing integrated circuit (IC) Back End Of Line (BEOL) process corners, the apparatus comprising:
    means for generating an output waveform with a frequency state, wherein the means for generating comprises a plurality of ring oscillator interconnections;
    means for selecting the frequency state based on a plurality of ring oscillator stage time delays; and
    means for modifying the plurality of ring oscillator stage time delays through a coupling between a plurality of shield net stages and a plurality of ring oscillator stages, wherein the IC BEOL process corners are based on resistance and capacitance values of the plurality of ring oscillator interconnections.

21. The apparatus of claim 20, wherein each of the plurality of ring oscillator interconnections is between two adjacent ring oscillator stages of the plurality of ring oscillator stages.

22. The apparatus of claim 21, wherein each of the plurality of ring oscillator stage time delays comprises a resistance and a capacitance of each of the plurality of ring oscillator interconnections.

* * * * *